US010141278B2

(12) United States Patent
Horibe et al.

(10) Patent No.: US 10,141,278 B2
(45) Date of Patent: Nov. 27, 2018

(54) CHIP MOUNTING STRUCTURE

(71) Applicant: International Business Machines Corporation, Armonk, NY (US)

(72) Inventors: Akihiro Horibe, Yokohama (JP); Keiji Matsumoto, Kawasaki (JP); Keishi Okamoto, Kawasaki (JP); Kazushige Toriyama, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/804,478

(22) Filed: Nov. 6, 2017

(65) Prior Publication Data

US 2018/0076162 A1 Mar. 15, 2018

Related U.S. Application Data

(63) Continuation of application No. 15/255,588, filed on Sep. 2, 2016, now Pat. No. 9,893,031, which is a
(Continued)

(30) Foreign Application Priority Data

Nov. 29, 2013 (JP) .................................. 2013247505
Dec. 13, 2013 (JP) .................................. 2013257637

(51) Int. Cl.
*H01L 21/00* (2006.01)
*H01L 23/495* (2006.01)
(Continued)

(52) U.S. Cl.
CPC ............ *H01L 24/13* (2013.01); *B23K 3/0623* (2013.01); *H01L 21/4867* (2013.01);
(Continued)

(58) Field of Classification Search
CPC ..... H01L 25/0657; H01L 24/13; H01L 24/83; H01L 24/81; H01L 24/11; H01L 24/17; H01L 24/29; H01L 24/14; H01L 23/49894
See application file for complete search history.

(56) References Cited

U.S. PATENT DOCUMENTS 9,893,031 B2 * 2/2018 Horibe .................... H01L 24/13

FOREIGN PATENT DOCUMENTS

JP 05047842 2/1993
JP 05047955 2/1993
(Continued)

OTHER PUBLICATIONS

U.S. Appl. No. 15/255,588, filed Sep. 2, 2016.
(Continued)

*Primary Examiner* — Alonzo Chambliss
(74) *Attorney, Agent, or Firm* — Fleit Gibbons Gutman Bongini Bianco PL; Jon A. Gibbons

(57) ABSTRACT

Highly reliable chip mounting is accomplished by using a substrate having such a shape that a stress exerted on a flip-chip-connected chip can be reduced, so that the stress exerted on the chip is reduced and separation of an interlayer insulating layer having a low dielectric constant (low-k) is minimized. Specifically, in a chip mounting structure, a chip including an interlayer insulating layer having a low dielectric constant (low-k) is flip-chip connected to a substrate via bumps is shown. In the chip mounting structure, the substrate has such a shape that a mechanical stress exerted on the interlayer insulating layer at corner portions of the chip due to a thermal stress is reduced, the thermal stress occurring due to a difference in coefficient of thermal expansion between the chip and the substrate.

7 Claims, 9 Drawing Sheets

Related U.S. Application Data continuation of application No. 14/930,984, filed on Nov. 3, 2015, now Pat. No. 9,508,594, which is a continuation of application No. 14/548,583, filed on Nov. 20, 2014, now Pat. No. 9,299,606.

(51) Int. Cl.
| | | |
|---|---|---|
| *H05K 7/00* | (2006.01) | |
| *H01L 23/00* | (2006.01) | |
| *H01L 23/34* | (2006.01) | |
| *H01L 23/522* | (2006.01) | |
| *H01L 21/768* | (2006.01) | |
| *H01L 25/065* | (2006.01) | |
| *H01L 25/00* | (2006.01) | |
| *H01L 23/498* | (2006.01) | |
| *H01L 21/48* | (2006.01) | |
| *B23K 3/06* | (2006.01) | |
| *H01L 23/488* | (2006.01) | |
| *H01L 23/48* | (2006.01) | |

(52) U.S. Cl.
CPC .. *H01L 21/76802* (2013.01); *H01L 21/76877* (2013.01); *H01L 23/34* (2013.01); *H01L 23/345* (2013.01); *H01L 23/49816* (2013.01); *H01L 23/49894* (2013.01); *H01L 23/5226* (2013.01); *H01L 24/08* (2013.01); *H01L 24/11* (2013.01); *H01L 24/14* (2013.01); *H01L 24/17* (2013.01); *H01L 24/27* (2013.01); *H01L 24/29* (2013.01); *H01L 24/32* (2013.01); *H01L 24/73* (2013.01); *H01L 24/742* (2013.01); *H01L 24/81* (2013.01); *H01L 24/83* (2013.01); *H01L 24/92* (2013.01); *H01L 25/0657* (2013.01); *H01L 25/50* (2013.01); *H01L 23/481* (2013.01); *H01L 23/488* (2013.01); *H01L 24/16* (2013.01); *H01L 2224/0401* (2013.01); *H01L 2224/05027* (2013.01); *H01L 2224/11013* (2013.01); *H01L 2224/1131* (2013.01); *H01L 2224/1148* (2013.01); *H01L 2224/11312* (2013.01); *H01L 2224/11416* (2013.01); *H01L 2224/11618* (2013.01); *H01L 2224/13013* (2013.01); *H01L 2224/13014* (2013.01); *H01L 2224/13015* (2013.01); *H01L 2224/13109* (2013.01); *H01L 2224/13111* (2013.01); *H01L 2224/14051* (2013.01); *H01L 2224/16111* (2013.01); *H01L 2224/16145* (2013.01); *H01L 2224/16227* (2013.01); *H01L 2224/16238* (2013.01); *H01L 2224/17519* (2013.01); *H01L 2224/27* (2013.01); *H01L 2224/27416* (2013.01); *H01L 2224/27515* (2013.01); *H01L 2224/27618* (2013.01); *H01L 2224/29011* (2013.01); *H01L 2224/29012* (2013.01); *H01L 2224/2919* (2013.01); *H01L 2224/29076* (2013.01); *H01L 2224/29109* (2013.01); *H01L 2224/29111* (2013.01); *H01L 2224/73104* (2013.01); *H01L 2224/73204* (2013.01); *H01L 2224/81* (2013.01); *H01L 2224/81191* (2013.01); *H01L 2224/81193* (2013.01); *H01L 2224/81203* (2013.01); *H01L 2224/81204* (2013.01); *H01L 2224/81801* (2013.01); *H01L 2224/81815* (2013.01); *H01L 2224/83* (2013.01); *H01L 2224/83203* (2013.01); *H01L 2224/83204* (2013.01); *H01L 2224/9211* (2013.01); *H01L 2224/94* (2013.01); *H01L 2225/06513* (2013.01); *H01L 2225/06568* (2013.01); *H01L 2924/00* (2013.01); *H01L 2924/014* (2013.01); *H01L 2924/06* (2013.01); *H01L 2924/12042* (2013.01); *H01L 2924/3512* (2013.01); *H01L 2924/37001* (2013.01); *H01L 2924/3841* (2013.01)

(56) References Cited

FOREIGN PATENT DOCUMENTS

| | | |
|---|---|---|
| JP | 06045401 | 2/1994 |
| JP | 08008354 | 1/1996 |
| JP | 08064717 | 3/1996 |
| JP | 2002100699 | 4/2002 |
| JP | 20130257637 | 12/2013 |

OTHER PUBLICATIONS

U.S. Appl. No. 14/930,987, filed Nov. 9, 2016, U.S. Pat. No. 9,508,594.

U.S. Appl. No. 14/548,583, filed Mar. 9, 2016, U.S. Pat. No. 9,299,606.

* cited by examiner

CHIP MOUNTING STRUCTURE

CROSS-REFERENCE TO RELATED APPLICATIONS

This application is based upon and claims priority from prior U.S. patent application Ser. No. 15/255,588 filed on Sep. 2, 2016, which claims priority from prior U.S. patent application Ser. No. 14/930,984 filed on Nov. 3, 2015, which claims priority from Japanese Patent Application Number 2013247505 filed on Nov. 29, 2013 and Japanese Patent Application Number 2013257637 filed on Dec. 13, 2013, the entire disclosure of each is hereby incorporated by reference in its entirety.

BACKGROUND

The present invention relates to a technology of mounting an integrated circuit (IC) chip (or simply "a chip", below) on a substrate and particularly to a chip mounting structure in which a chip is mounted on a substrate having such a shape that a stress exerted on a flip-chip-connected chip is reduced.

In these years, with size reduction of semiconductor devices, the dielectric constant (k) of a material of interlayer insulators in the back end of line (BEOL) has been decreasing. However, a material of insulators having a low dielectric constant, such as SiCOH (hydroxyl silicon carbide), is porous and is thus very brittle. The interlayer insulating layer itself thus has a low mechanical strength and becomes separated due to a stress being exerted at the time of cooling after being subjected to flip chip mounting and reflow soldering.

Since a chip and a substrate on which the chip is mounted are connected together with a lead-free solder, which is harder and less ductile than a lead solder that has been used thus far, the stress exerted on the interlayer insulating layer due to a difference in coefficient of thermal expansion between the chip and the substrate has been increasing.

In addition, thinning of printed circuit boards employing, for example, organic substrates for the purpose of an improvement of electrical characteristics or a cost reduction as a result of reduction of the number of layers increases the warpage of the substrate, leading to an increase of the stress exerted on the interlayer insulating layer.

FIG. 1 roughly illustrates the state where the interlayer insulating layer is separated from an adjacent layer. A low-k layer 105 is disposed on the surface of a semiconductor substrate 100 made of a material such as silicon, an insulating layer 110 made of a material such as an oxide is disposed on the low-k layer 105, and a protective layer 115 made of a material such as photosensitive polyimide (PSPI) is disposed on the insulating layer 110. The protective layer 115 has an opening at a position corresponding to an electrode of the low-k layer 105 and an under-bump metallurgy (UBM) layer 120 is disposed in the opening. A bump 125 such as a solder is disposed on the UBM layer 120. When a stress is exerted on the bump 125 in the direction indicated with the arrow of FIG. 1, a crack 130 develops between the low-k layer 105 and the insulating layer 110 so as to separate these layers.

Japanese Patent Application Publication No. 5-47955 describes a support board disposed between a semiconductor device and a circuit board. Electrode terminals are disposed on the surface of the support board so as to face electrode terminals disposed on the peripheral portion of the semiconductor device. Electrode terminals electrically connected with the electrode terminals on the surface of the support board are arranged in a grid form on the back surface of the support board. The electrode terminals on the surface of the support board and the electrode terminals on the back surface of the support board are respectively connected, via bumps, with the semiconductor device and the circuit board. Thus, the stress that occurs due to a difference in coefficient of thermal expansion between the semiconductor device and the circuit board is dispersed into bumps arranged in the grid form, whereby malfunctions of a circuit device due to stress concentration are minimized.

In the technology of Patent Application Publication No. 5-47955, the stress exerted on the semiconductor device is reduced by dispersing the stress that occurs due to the difference in coefficient of thermal expansion between the semiconductor device and the circuit board into bumps arranged in the grid form on the back surface of the support board disposed between the semiconductor device and the circuit board. Since this technology involves disposition of the support board between the semiconductor device and the circuit board, an arrangement of electrode terminals on the back surface of the support board is limited to the grid form and is not allowed to be changed in accordance with the design of the circuit device.

Japanese Patent Application Publication No. 2002-100699 describes a semiconductor device in which a semiconductor chip has through-holes at corner portions and a reinforcement land having a ball bump on the connection side is formed through each through-hole. When the chip is mounted on a mounting substrate, the reinforcement lands are connected to the substrate so that the thermal stress exerted on circuit connection pads adjacent to the corners of the semiconductor chip attenuates, whereby separation or electrical disconnection of the circuit connection pads is minimized.

The technology of Japanese Patent Application Publication No. 2002-100699 involves formation of a reinforcement land at each corner portion of a semiconductor chip and occupation of an area for the reinforcement land at each corner portion of the semiconductor chip, whereby the use of the corner portions of the semiconductor chip is limited and thus the corner portions are not allowed to be used freely.

SUMMARY

An object of the present invention is to accomplish highly reliable chip mounting by using a substrate having such a shape that a stress exerted on a flip-chip-connected chip can be reduced, so that the stress exerted on the chip is reduced and separation of an interlayer insulating layer having a low dielectric constant (low-k) is minimized. The object of the present invention includes providing a chip mounting structure in which a chip is mounted on a substrate having the above-described shape. A chip mounting structure according to an embodiment of the present invention includes a chip including an interlayer insulating layer having a low dielectric constant and a substrate to which the chip is flip-chip connected via a bump, wherein the substrate has such a shape that a mechanical stress exerted on the interlayer insulating layer at a corner portion of the chip due to a thermal stress is reduced, the thermal stress occurring due to a difference in coefficient of thermal expansion between the chip and the substrate.

Preferably, the substrate has such a shape that satisfies A<B where A denotes a distance from each of corners of the chip to a corresponding position on an edge of the substrate that is on a line extending from a center of the chip, positioned at the same position as a center of the substrate, through the corner of the chip and B denotes a distance from each of sides of the chip to a corresponding portion of the edge of the substrate, the corresponding portion being parallel to the side of the chip.

Preferably, the substrate has a shape of a square from which squares each having sides of a length c are cut off at corner portions of the square, where the length c is expressed as the following expression:

$$c > \left(1 - \frac{\sqrt{2}}{2}\right)B. \qquad \text{Expression 1}$$

Preferably, the substrate has a shape of a square from which right-angled isosceles triangles each having two sides of a length d are cut off at corner portions of the square, where the length d is expressed as the following expression:

$$d > (2-\sqrt{2})B \qquad \text{Expression 2}$$

Preferably, the substrate has a shape of a square from which elongated cuts that extend a length e from the corresponding corners of the square toward the corresponding corners of the chip are cut off, where the length e is expressed as the following expression:

$$e > (\sqrt{2}-1)B \qquad \text{Expression 3}$$

Preferably, the substrate has a shape of a circle having a center positioned at the same position as a center of the chip and having a radius longer than a distance from the center of the chip to each of corners of the chip.

In the present invention, highly reliable chip mounting is accomplished by using a substrate having such a shape that a stress exerted on a flip-chip-connected chip can be reduced, so that the stress exerted on the chip is reduced and separation of an interlayer insulating layer having a low dielectric constant (low-k) is minimized. Particularly, the highly reliable chip mounting is accomplished by a chip mounting structure, in which a chip is mounted on a substrate having the above-described shape, provided through the present invention.

In a chip mounting structure according to the present invention, the stress exerted on a chip is reduced by using a substrate having a predetermined shape. Thus, unlike in the case of the technology of Japanese Patent Application Publication No. 5-47955, the chip mounting structure according to the present invention does not involve the use of an additional support board between a semiconductor device and a circuit board, whereby the production cost of the chip mounting structure can be minimized. Moreover, unlike in the case of the technology of Japanese Patent Application Publication No. 2002-100699, the chip mounting structure does not involve occupation of an area adjacent to each corner of a semiconductor chip for reinforcement, whereby the area adjacent to each corner of the chip can be effectively used.

BRIEF DESCRIPTION OF THE DRAWINGS

The accompanying figures wherein reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
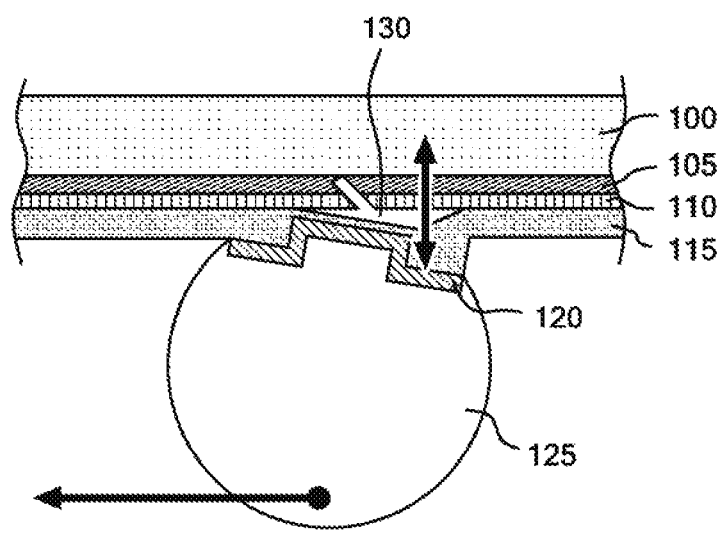
FIG. 1 is a cross-sectional view that roughly illustrates the state where an interlayer insulating layer is separated from an adjacent layer.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Best modes for embodying the present invention will be illustrated below in detail with reference to the drawings. However, the present invention within the scope of claims is not limited to the following embodiments. In addition, all the combinations of the characteristics described in the embodiments are not necessarily essential to solution to problems. The present invention may be embodied in various different modes and should not be understood as being limited to the contents described in the embodiments. Throughout the entire description of the embodiments, the same components are denoted by the same reference numerals.

The inventors have studied the relationship between the shape of a substrate and a stress exerted on the chip by performing structure analysis of a chip mounting structure using, for example, a finite element method (FEM). The inventors have thus found that changing the shape of the substrate on the basis of the studied relationship reduces the stress exerted on the interlayer insulating layer through bumps at the corners of the chip.

Figure 2:
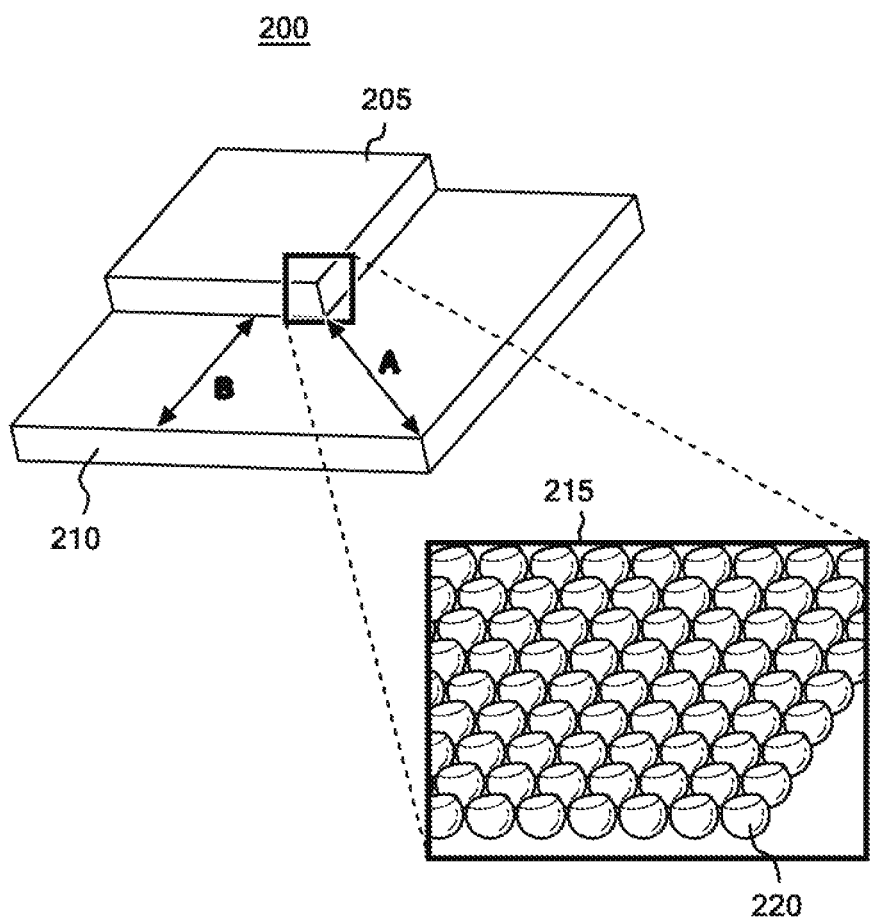
FIG. 2 is a perspective view schematically illustrating a first chip mounting structure subjected to structure analysis.

FIG. 2 is a perspective view schematically illustrating a first chip mounting structure 200 subjected to structure analysis. The chip mounting structure 200 has such a structure in which a chip 205 is mounted on an existing rectangular substrate 210. In a portion 215 in FIG. 2, an arrangement of bumps 220 at a corner portion of the chip 205 is schematically illustrated in an enlarged manner. In the chip mounting structure 200, a distance A from a corner of the chip 205 to the corresponding position on the edge of the substrate 210 is longer than a distance B from a side of the chip 205 to the corresponding side of the substrate 210 that is parallel to the side of the chip 205, that is, A>B.

Figure 3:
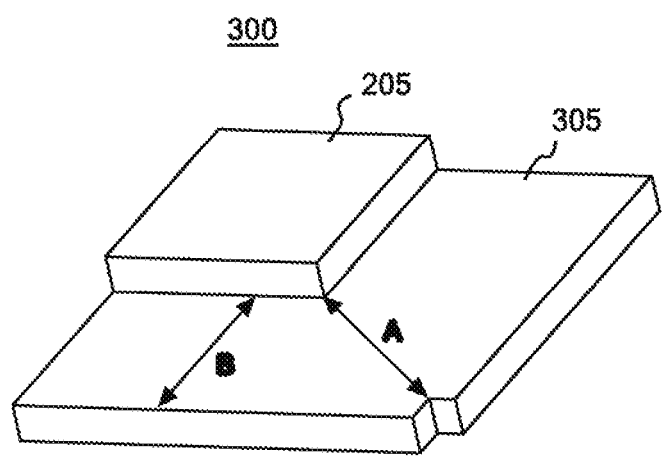
FIG. 3 is a perspective view schematically illustrating a second chip mounting structure subjected to structure analysis.

FIG. 3 is a perspective view schematically illustrating a second chip mounting structure 300 subjected to structure analysis. The chip mounting structure 300 has such a structure in which a chip 205 is mounted on a substrate 305 having such a shape that small rectangular corner portions are cut off. In the chip mounting structure 300, a distance A from a corner of the chip 205 to the corresponding position on the edge of the substrate 305 is equal to a distance B from a side of the chip 205 to the corresponding side of the substrate 305 that is parallel to the side of the chip 205, that is, A=B.

Figure 4:
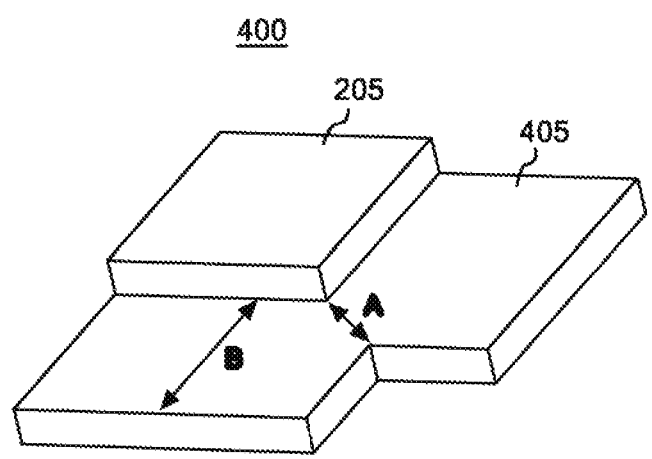
FIG. 4 is a perspective view schematically illustrating a third chip mounting structure subjected to structure analysis.

FIG. 4 is a perspective view schematically illustrating a third chip mounting structure 400 subjected to structure analysis. The chip mounting structure 400 has such a structure in which a chip 205 is mounted on a substrate 405 having such a shape that large rectangular corner portions are cut off. In the chip mounting structure 400, a distance A from a corner of the chip 205 to the corresponding position on the edge of the substrate 405 is shorter than a distance B from a side of the chip 205 to the corresponding side of the substrate 405 that is parallel to the side of the chip 205, that is, A<B.

Figure 5:
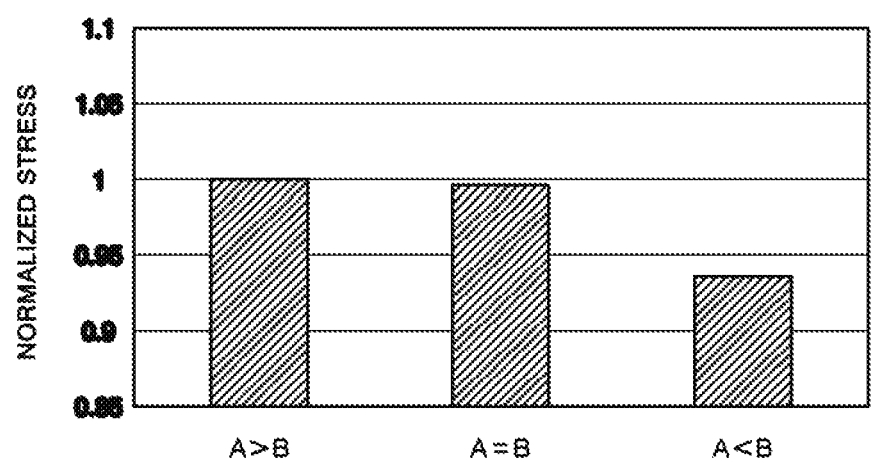
FIG. 5 is a bar graph illustrating a normalized form of the stress that occurs at the corners of a chip in each of the first to third chip mounting structures subjected to structure analysis.

FIG. 5 is a bar graph illustrating a normalized form of the stress that occurs at the corners of a chip in each of the first to third chip mounting structures 200, 300, and 400 subjected to structure analysis. The stress is normalized with reference to the stress that occurs in the first chip mounting structure 200 (where A>B). In the case of the second chip mounting structure 300 (where A=B), the stress is reduced, although to a small degree, compared to the existing rectangular structure where A>B as a result of cutting off small rectangular corner portions so that A=B. In the case of the third chip mounting structure 400 (where A<B), the stress is substantially reduced compared to the existing rectangular structure where A>B as a result of cutting off large rectangular corner portions so that A<B.

On the basis of this finding, the inventor has developed the use of a substrate having a shape in which A<B and in which the mechanical stress exerted on the interlayer insulating layer at corner portions of the chip is reduced. Highly reliable chip mounting is accomplished by using a chip mounting structure in which a chip is mounted on a substrate having such a shape.

Figure 6A:
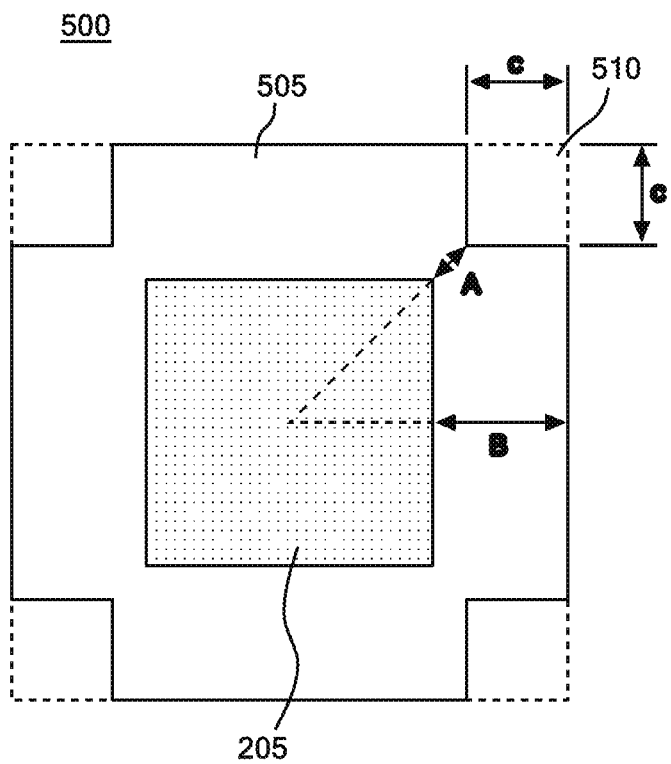
FIG. 6(A) is a top plan view schematically illustrating a chip mounting structure according to a first embodiment of the present invention.
Figure 6B:
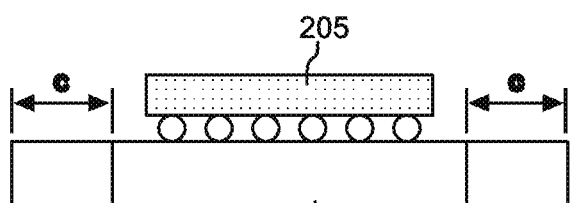
FIG. 6(B) is a side view of the chip mounting structure according to the first embodiment.

FIG. 6 schematically illustrates a chip mounting structure 500 according to a first embodiment of the present invention. FIG. 6(A) is a top plan view of the chip mounting structure 500 and FIG. 6(B) is a side view of the chip mounting structure 500. In the chip mounting structure 500, a substrate 505 has a shape of a square from which squares 510 each having sides of a length c are cut off at corner portions of the square. In order that the substrate 505 has a shape that satisfies the condition A<B, the length c has to satisfy the following condition. Firstly, a distance A is calculated. The distance from a corner of the chip 205 to the corresponding corner of an original square of the substrate 505 from which the squares 510 are not cut off is expressed by the following expression:

$$\sqrt{2}B \qquad \text{Expression 4}$$

The length of the diagonal of the squares 510 is expressed by the following expression:

$$\sqrt{2}c \qquad \text{Expression 5}$$

Thus, the distance A is expressed by the following expression:

$$A=\sqrt{2}B-\sqrt{2}c=\sqrt{2}(B-c) \qquad \text{Expression 6}$$

Since A<B, the following expression is satisfied:

$$\sqrt{2}(B-c)<B \qquad \text{Expression 7}$$

When this expression is changed by changing the subject to the length c, the length c is expressed by the following expression:

$$c > \left(1 - \frac{\sqrt{2}}{2}\right)B. \qquad \text{Expression 8}$$

In order that the substrate 505 has a shape that satisfies A<B, the length c has to satisfy the above expression. For example, when the chip 205 is a 20 mm square and the original square of the substrate 505 is a 50 mm square, the distance B is 50/2-20/2, that is, 15 mm. When the distance B is 15 mm, the length c has to be longer than 4.4 mm.

Figure 7A:
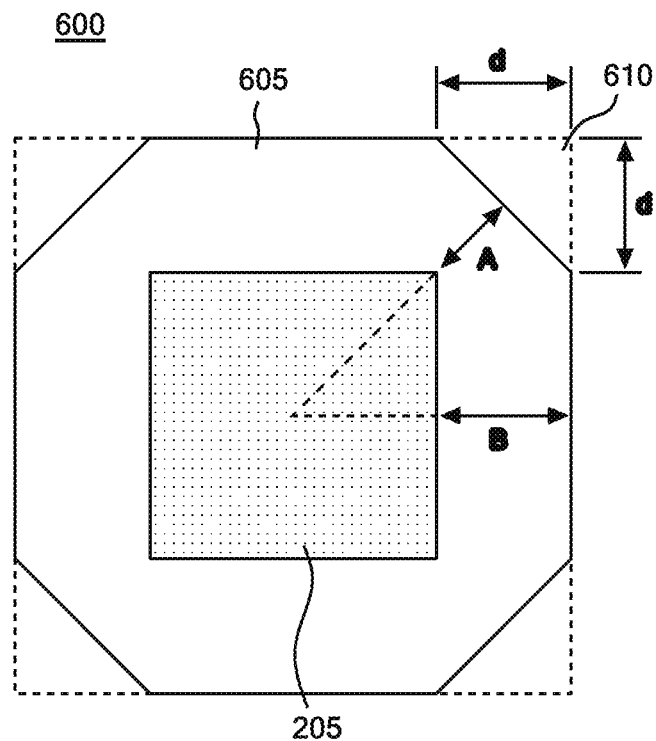
FIG. 7(A) is a top plan view schematically illustrating a chip mounting structure according to a second embodiment of the present invention.
Figure 7B:
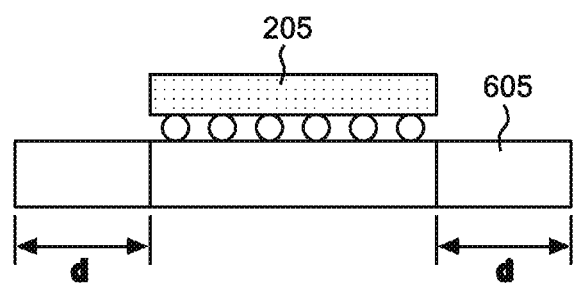
FIG. 7(B) is a side view of the chip mounting structure according to the second embodiment.

FIG. 7 schematically illustrates a chip mounting structure 600 according to a second embodiment of the present invention. FIG. 7(A) is a top plan view of the chip mounting structure 600 and FIG. 7(B) is a side view of the chip mounting structure 600. In the chip mounting structure 600, a substrate 605 has a shape of a square from which right-angled isosceles triangles 610 each having two sides of a length d are cut off at corner portions of the square. In order that the substrate 605 has a shape that satisfies the condition A<B, the length d has to satisfy the following condition. Firstly, a distance A is calculated. A distance from a corner of the chip 205 to the corresponding corner of an original square of the substrate 605 from which the right-angled isosceles triangles 610 are not cut off is expressed by the following expression:

$$\sqrt{2}B \qquad \text{Expression 9}$$

The length or the height from the base to the vertex of each right-angled isosceles triangle 610 is expressed by the following expression:

$$\sqrt{\frac{d^2}{2}} = \frac{d}{\sqrt{2}}$$ Expression 10

Thus, the distance A is expressed by the following expression:

$$A = \sqrt{2}B - \frac{d}{\sqrt{2}}.$$ Expression 11

Since A<B, the following expression is satisfied:

$$\sqrt{2}B - \frac{d}{\sqrt{2}} < B$$ Expression 12

When this expression is changed by changing the subject to the length d, the length d is expressed by the following expression:

$$d > (2-\sqrt{2})B$$ Expression 13

In order that the substrate 605 has a shape that satisfies A<B, the length d has to satisfy the above expression. For example, when the chip 205 is a 20 mm square and the original square of the substrate 605 is a 50 mm square, the distance B is 50/2-20/2, that is, 15 mm. When the distance B is 15 mm, the length d has to be longer than 8.8 mm.

Figure 8A:
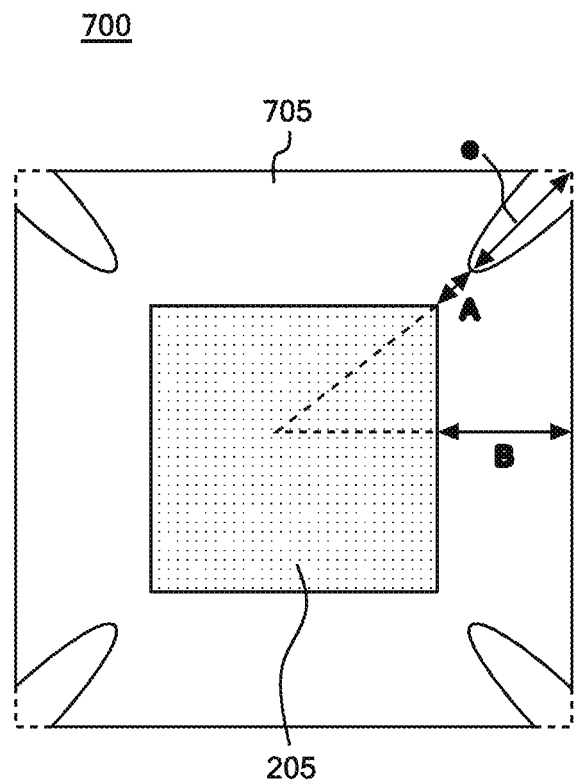
FIG. 8(A) is a top plan view schematically illustrating a chip mounting structure according to a third embodiment of the present invention.
Figure 8B:
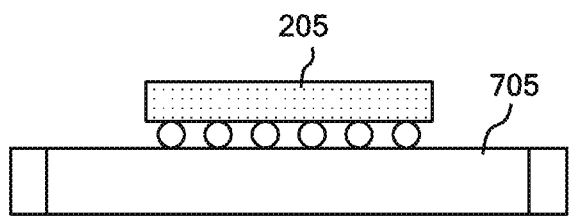
FIG. 8(B) is a side view of the chip mounting structure according to the third embodiment.

FIG. 8 schematically illustrates a chip mounting structure 700 according to a third embodiment of the present invention. FIG. 8(A) is a top plan view of the chip mounting structure 700 and FIG. 8(B) is a side view of the chip mounting structure 700. In the chip mounting structure 700, a substrate 705 has a shape of a square from which cuts 610 that extend a length e from the corresponding corners of the square toward the corners of the chip 205 are cut off. In order that the substrate 705 has a shape that satisfies the condition A<B, the length e has to satisfy the following condition. Firstly, a distance A is calculated. A distance from a corner of the chip 205 to the corresponding corner of an original square of the substrate 705 from which the cuts are not cut off is expressed by the following expression:

$$\sqrt{2}B$$ Expression 14

Since the cuts having a length e are cut off at corner portions of the original square, the distance A is expressed by the following expression:

$$A = \sqrt{2}B - e$$ Expression 15

Since A<B, the following expression is satisfied:

$$\sqrt{2}B - e < B$$ Expression 16

When this expression is changed by changing the subject to the length e, the length e is expressed by the following expression:

$$e > (\sqrt{2}-1)B$$ Expression 17

In order that the substrate 705 has a shape that satisfies A<B, the length e has to satisfy the above expression. For example, when the chip 205 is a 20 mm square and the original square of the substrate 705 is a 50 mm square, the distance B is 50/2-20/2, that is, 15 mm. When the distance B is 15 mm, the length e has to be longer than 6.2 mm.

Figure 9A:
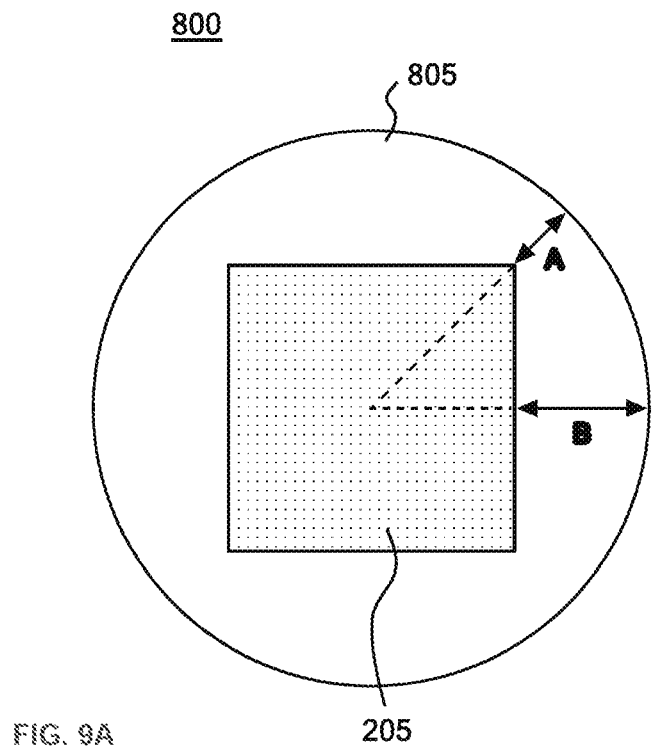
FIG. 9(A) is a top plan view schematically illustrating a chip mounting structure according to a fourth embodiment of the present invention.
Figure 9B:
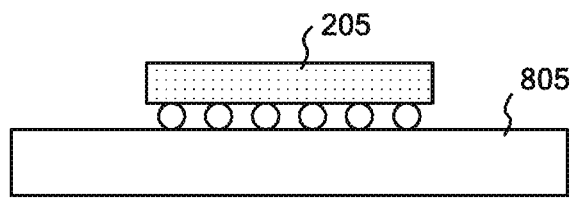
FIG. 9(B) is a side view of the chip mounting structure according to the fourth embodiment.

FIG. 9 schematically illustrates a chip mounting structure 800 according to a fourth embodiment of the present invention. FIG. 9(A) is a top plan view of the chip mounting structure 800 and FIG. 9(B) is a side view of the chip mounting structure 800. In the chip mounting structure 800, a substrate 805 has a circular shape that has a center at the same position as the center of the chip 205 and that has a radius longer than a distance from the center of the chip 205 to each corner of the chip 205. When the substrate 805 has such a circular shape, the distance A is calculated by subtracting half the diagonal of the chip 205 from the radius and the distance B is calculated by subtracting half the length of one side of the chip 205 from the radius. Since the diagonal of the chip 205 is longer than the length of one side of the chip 205, the substrate 805 has a shape that satisfies A<B. For example, when the chip 205 is a 20 mm square and the substrate 805 is a circle having a diameter of 50 mm, the distance A is calculated as 10.9 mm by subtracting half the diagonal of the chip 205, which is 14.1 mm, from the radius of 25 mm and the distance B is calculated as 15 mm by subtracting half the length of one side of the chip 205, which is 10 mm, from the radius of 25 mm. Thus, the substrate 805 has a shape that satisfies A<B.

Non-Limiting Examples

Although the present invention has been described thus far using some embodiments, the technical scope of the invention is not limited to the scope described in relation to these embodiments. The embodiments may be modified or improved in various manners and modes to which such modification or improvement has been made are also naturally included in the technical scope of the invention.

The description of the present application has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for changing a shape of a substrate to reduce stress exerted on an interlayer insulating layer of a chip, the method comprising:
    providing the substrate;
    mounting the chip on the substrate such that a center of the chip corresponds to a center of the substrate and such that sides of the chip are parallel to sides of the substrate;
    measuring a distance B between a side of the chip and a nearest side of the substrate; and
    cutting off square portions of the substrate from each corner of the substrate such that a distance between a corner of the chip and a nearest corner of the substrate is less than the distance B,
    wherein each square portion has sides of a length c, and wherein $$c > \left(1 - \frac{\sqrt{2}}{2}\right)B.$$

2. A method for mounting a chip on a substrate, the method comprising:

providing a chip having an interlayer insulating layer, the interlayer insulating layer having a low dielectric constant;

mounting the chip to a substrate such that there is a distance B between a side of the chip and a nearest side of the substrate;

connecting the chip to the substrate using flip-chip bumps; and cutting off right-angle isosceles triangle portions of the substrate from each corner of the substrate such that a distance between each corner of the chip and a nearest corner of the substrate is less than the distance B, wherein each right-angle isosceles triangle portion has two sides of a length d, and wherein $$d > (2-\sqrt{2})B.$$

3. The method of claim 2, wherein the substrate is square.
4. The method of claim 3, wherein the chip is square.
5. The method of claim 2, wherein the chip is square.
6. The method of claim 5, wherein the substrate is square.
7. A method for forming a chip mounting structure, the method comprising:

providing a square substrate;

connecting a square chip to the square substrate by flip-chip bumps such that a center of the square chip corresponds to a center of the square substrate and such that sides of the square chip are parallel to sides of the square substrate;

measuring a distance B between a side of the square chip and a nearest side of the square substrate; and removing elongated portions of the square substrate from each corner of the square substrate, the elongated portions extending a length e from corners of the square substrate toward corresponding corners of the square chip, wherein $$e > (\sqrt{2}-1)B.$$

* * * * *